United States Patent [19]

Mitchell et al.

[11] Patent Number: 4,597,060
[45] Date of Patent: Jun. 24, 1986

[54] EPROM ARRAY AND METHOD FOR FABRICATING

[75] Inventors: Allan T. Mitchell, Garland; James L. Paterson, Richardson, both of Tex.

[73] Assignee: Texas Instruments Incorporated, Dallas, Tex.

[21] Appl. No.: 729,439

[22] Filed: May 1, 1985

[51] Int. Cl.$^4$ .............................................. G11C 11/40
[52] U.S. Cl. ........................................ 365/185; 365/189
[58] Field of Search ....................... 365/185, 189, 230

[56] References Cited

U.S. PATENT DOCUMENTS 4,532,535  6/1985  Gerber ................................ 365/185

Primary Examiner—Terrell W. Fears
Attorney, Agent, or Firm—Douglas A. Sorensen; Robert Groover, III; Melvin Sharp

[57] ABSTRACT

Using a method according to one embodiment of the present invention, an EPROM array may be fabricated providing a dense EPROM array.

First the polycrystalline silicon floating gates are formed and partially patterned on the surface of a substrate. A thin thermally grown oxide layer is then formed over the entire array. The source/drain regions are then implanted through the thin silicon dioxide layer into the substrate. Next a thick silicon dioxide layer is deposited by chemical vapor deposition on the surface of the array. The surface of the array is then coated with photoresist which, because of its nature, provides a planarized surface on the top layer of photoresist. The photoresist and the silicon dioxide layer are then etched using an etching process which provides an etching ratio of 1 to 1 between photoresist and silicon dioxide. The photoresist is completely etched away thus leaving the planarized silicon dioxide surface. The silicon dioxide layer is then further etched so that the top surfaces of the floating gates are exposed. An interlevel insulator layer is then formed on the surface of the array and the active gates are then formed on the surface of the interlevel insulator.

In another embodiment of the present invention, a step for forming refractory metal silicide regions on the bitlines of the array is included. The use of silicided bitlines in this type of array is precluded in the prior art because thick field oxide regions must be thermally grown over the silicided regions using the prior art techniques. The growth of silicon dioxide over silicided regions is very difficult if not impossible.

7 Claims, 12 Drawing Figures

EPROM ARRAY AND METHOD FOR FABRICATING

FIELD OF THE INVENTION

This invention relates to the field of integrated circuit fabrication. More specifically, this invention relates to the field of electrically programmable read only memory (EPROM) fabrication.

BACKGROUND OF THE INVENTION

An EPROM is a read only memory device in which the stored data may be erased and new data written in its stead. A widely used type of EPROM is a floating gate field effect transistor type. See Sze, Physics of Semiconductor Devices, Section 8.61 (1981).

A partial schematic diagram of an EPROM using floating gate field effect transistors is shown in FIG. 1. Memory cells 26-1-1 through 26-2-4 are floating gate field effect transistors. Row decoder 28 provides output signals on row lines 24-1 and 24-2 in response to signals provided on row address input leads 21 and from read/write indicator 23. Column decoder 29 provides and receives signals on column lines 25-1 through 25-5 in response to signals provided on column address input leads 22 and from read/write indicator 23. A memory output signal is provided on output lead 27.

A data bit stored in, for example, memory cell 26-1-1 is read by providing a high voltage output signal on row line 24-1 and providing a low voltage output signal on all other row lines. Column decoder 29 then senses, via column lines 25-1 and 25-2, the impedance of memory cell 26-1-1. If the floating gate of memory cell 26-1-1 contains excess electrons, the negative charge of these excess electrons raises the threshold voltage of memory cell 26-1-1 so that the voltage provided on row line 24-1 is insufficient to cause the channel of memory cell 26-1-1 to conduct. Therefore, column decoder 29 detects a high impedance and provides an appropriate signal on output lead 27. If there are no excess electrons stored on the floating gate on memory cell 26-1-1 then the voltage supplied on row line 24-1 is sufficient to cause memory cell 26-1-1 to conduct. Therefore, column decoder 29 detects a low impedance and provides the appropriate signal on output lead 27.

EPROM 20 is thus programmed by negatively charging the floating gate of selective memory cells. This is accomplished by injecting hot electrons through the insulating layer beneath the floating gate from the substrate of the memory cell.

A problem involved with the fabrication of EPROMs using the techniques in the prior art (see for example McElroy, U.S. Pat. No. 4,151,021, entitled "Method of Making a High Density Floating Gate Electrically Programmable ROM", issued Apr. 24, 1979) occurs during the formation of thick field regions 29 of FIG. 4b of McElroy. These regions are formed in the prior art by thermal oxidation. Thermal oxidation consumes silicon from the substrate laterally as well as vertically. Thus a buffer region must be allowed in the patterning of the oxidation mask for thick oxide regions to provide for this lateral movement of the oxidized region. This buffer region increases the substrate surface area required to fabricate an EPROM using prior art techniques.

SUMMARY OF THE INVENTION

Using a method according to one embodiment of the present invention, an EPROM array may be fabricated providing a dense EPROM array.

First the polycrystalline silicon floating gates and gate oxide layers are formed and partially patterned on the surface of a substrate. A thin thermally grown oxide layer is then formed over the entire array. The source/drain regions are then implanted through the thin silicon dioxide layer into the substrate. Next a thick silicon dioxide layer is deposited by chemical vapor deposition on the surface of the array. The surface of the array is then coated with photoresist which, because of its nature, provides a planarized surface on the top layer of photoresist. The photoresist and the silicon dioxide layer are then etched using an etching process which provides an etching ratio of 1 to 1 between photoresist and silicon dioxide. The photoresist is completely etched away thus leaving the planarized silicon dioxide surface. The silicon dioxide layer is then further etched so that the top surfaces of the floating gates are exposed. An interlevel insulator layer is then formed on the surface of the array and the active gates are then formed on the surface of the interlevel insulator.

In another embodiment of the present invention, a step for forming refractory metal silicide regions in the bitlines of the array is included. The use of silicided bitlines in this type of array is precluded in the prior art because thick field oxide regions must be thermally grown over the silicided regions, using the prior art techniques. The growth of silicon dioxide over silicided regions is very difficult if not impossible. In yet another embodiment of the present invention, polycrystalline silicon "caps" are include on the top surface of the floating gates. These "caps" provide increased capacitive coupling between the active gates and the floating gates, thereby increasing programming efficiency.

DETAILED DESCRIPTION

Figure 1:
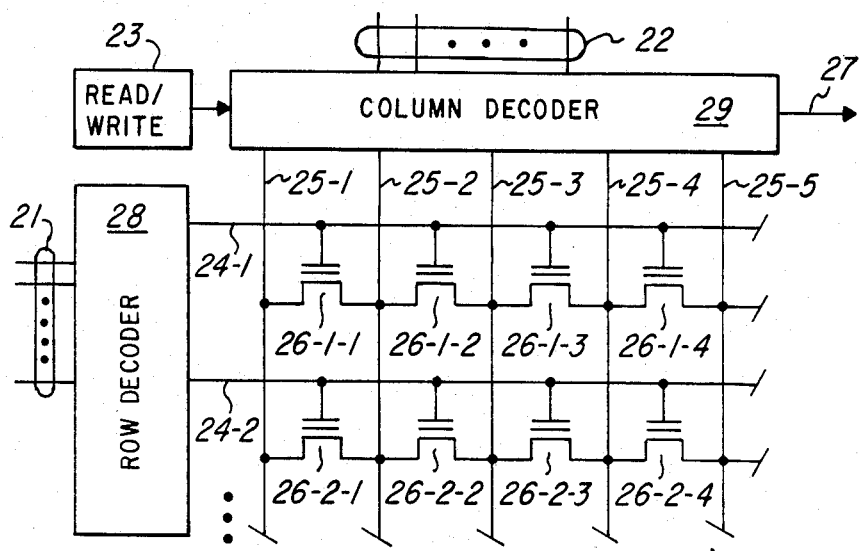
FIG. 1 is a schematic diagram of an EPROM.
Figure 2A:
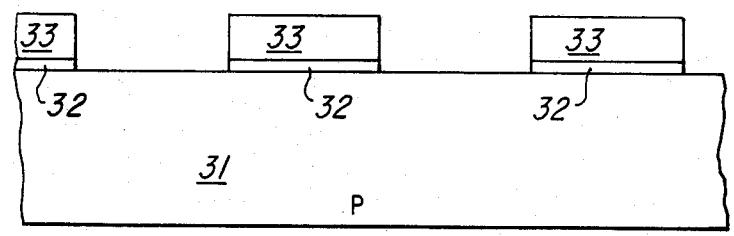
FIGS. 2A through 2E are side view schematic diagrams depicting the processing steps of one embodiment of the present invention.
Figure 2B:
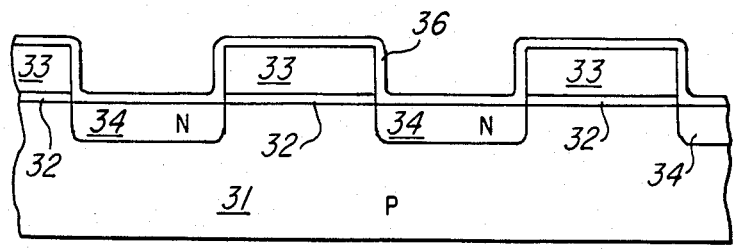
Figure 2C:
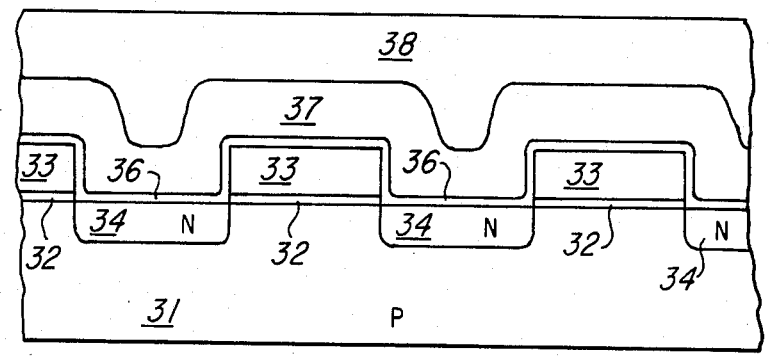
Figure 2D:
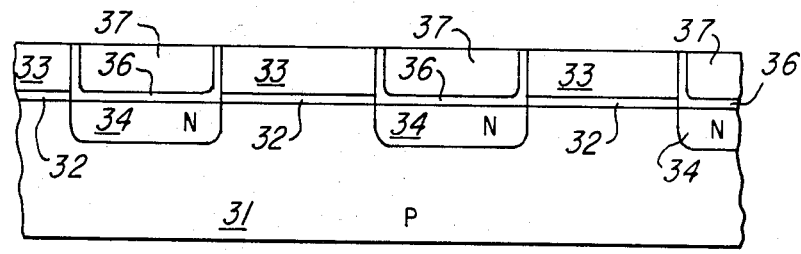

FIGS. 2A through 2E are side view schematic diagrams depicting the processing steps of one embodiment of the present invention. FIGS. 2A through 2E are taken from a section of an array constructed according to the teachings of this invention. Polycrystalline silicon layer 33 and gate oxide layer 32 are formed on the surface of substrate 1 using techniques well known in the art to provide the structure shown in FIG. 2A. The structure of FIG. 2A is then subjected to a thermal oxidation to form silicon dioxide layer 36. Silicon dioxide layer 36 is included as one method for enhancing charge retention of the floating gate. An ion implantation is then performed of dopant ions, such as arsenic ions having an energy of approximately 150 kiloelectron-volts and a density of approximately 5E15 ions per centimeter squared. This ion implantation is driven-in to form source/drain regions 34 as shown in FIG. 2B. A thick silicon dioxide layer is then formed on the surface of the structure of FIG. 2B by chemical vapor deposition to form silicon dioxide layer 37 as shown in FIG. 2C. On the surface of silicon dioxide layer 37, a layer of photoresist is applied to form photoresist layer 38. Because the photoresist which is used to provide photoresist layer 38 is liquid when applied, the surface of photoresist layer 38 is approximately planar. The structure of FIG. 2C is then subjected to an anisotropic etching process which etches photoresist layer 38 and silicon dioxide layer 37 in an etching ratio of 1 to 1. The etching rates for various etching facilities varies widely and each facility must adjust its process to provide an etching rate which is approximately 1-1 between photoresist and silicon dioxide; however, a plasma etching process using a C2F6+CHF3+02 plasma has been used to provide this ratio. The etch is continued until the surface of polysilicon layer 33 is exposed. The resulting structure is shown in FIG. 2D.

Figure 2E:
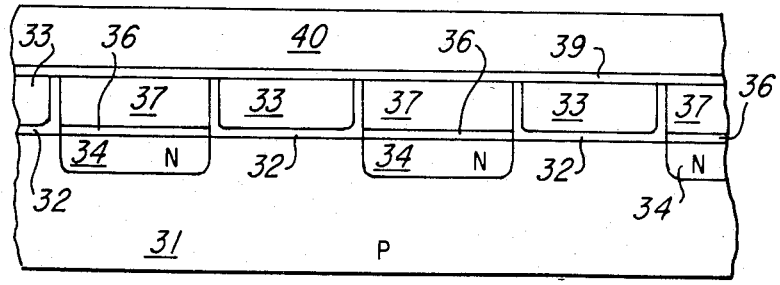

Interlevel dielectric layer 39 is then formed on the surface of the structure of FIG. 2D as shown in FIG. 2E. An active gate material such as polycrystalline silicon layer 40 is then formed on the surface of interlevel insulator layer 39. Polysilicon layer 40 forms the word lines for the EPROM array fabricated using this embodiment of the invention. Of importance, polysilicon layer 40 is planar and is not formed on the sides of polycrystalline silicon layer 33 which is used to form the floating gates of the memory cells of the EPROM array. Because polycrystalline silicon layer 40 is not formed on the sides of polycrystalline layer 33, polycrystalline silicon layer 40 may be completely etched without leaving destructive filaments.

Figure 3A:
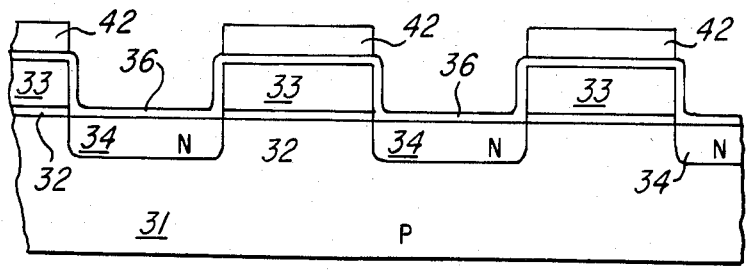
FIGS. 3A through 3C are side view schematic drawings depicting another embodiment of the present invention which embodiment include silicide source/drain regions.
Figure 3B:
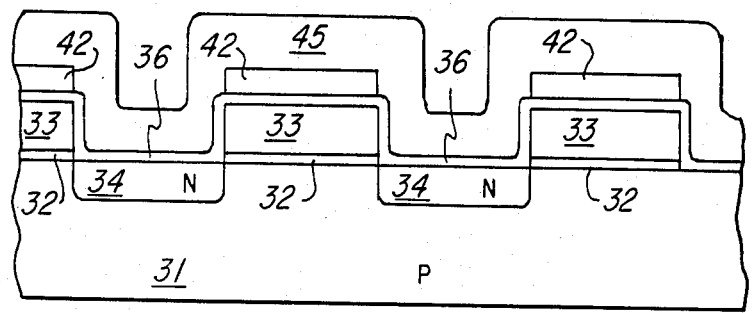
Figure 3C:
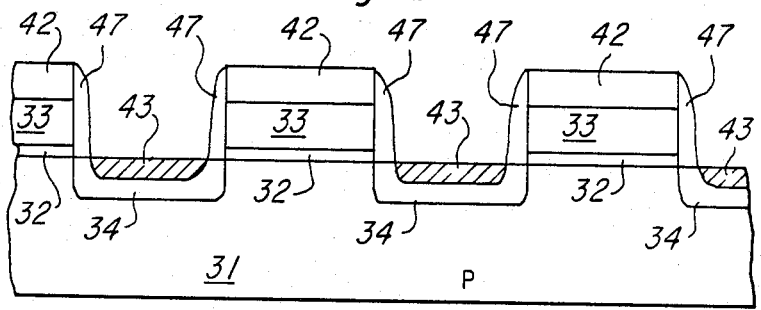

In another embodiment of the present invention, masking layer 42, which is composed of a silicon dioxide layer and a silicon nitride layer, is formed and patterned along with polycrystalline silicon layer 33 as shown in FIG. 3A. Thin oxide layer 36 is then grown by thermal oxidation. The resulting structure is then subjected to an ion implantation as described with regard to FIGS. 2A through 2E. This forms source/drain regions 34 as shown in FIG. 3A. (Components having the same identification number in FIGS. 3A through 3C as those in FIGS. 2A through 2E perform the same function.) Silicon dioxide layer 45 is then formed on the structure of FIG. 3A by chemical vapor deposition as shown in FIG. 3B and then is anisotropically etched back to form sidewall silicon dioxide layers 47 as shown in FIG. 3C. This anisotropic etching process completely removes silicon dioxide layer 45 above source/drain regions 34 but does not remove masking layer 42 on top of polycrystalline silicon gate 33. The structure is then subjected to a contact silicidation process using techniques well known in the art to form refractory metal silicide regions 43 on the surface of source/drain regions 34. These silicide regions lower the sheet resistance of source/drain regions 34 so that source/drain regions 34 may be used as column leads for the EPROM using a minimum number of contact points form the metal column leads (not shown) used to compensate for the higher resistivity of source/drain regions 34. In addition, silicide regions 43 provide better ohmic contact to the metal column leads (not shown) which contact source/drain regions 34. These properties lower the overall column lead resistance, thus lowering the resistance-capacitance product for circuits including these column leads and thus increasing the speed of the memory array.

Figure 4A:
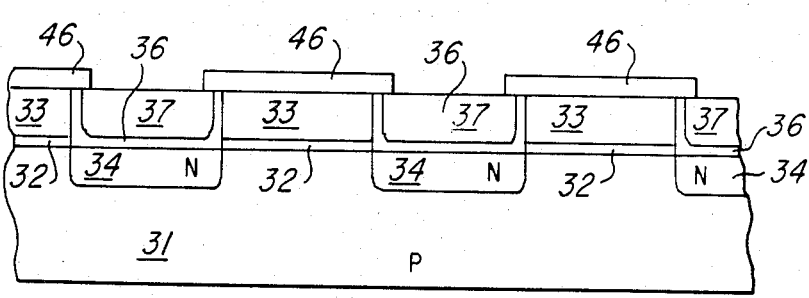
FIGS. 4A and 4B are side view schematic diagrams depicting another embodiment of the present invention which includes polycrystalline silicon layers between the floating gate and the interlevel insulator for increased capacitive coupling between the active gate and the floating gate of the EPROM cell.
Figure 4B:
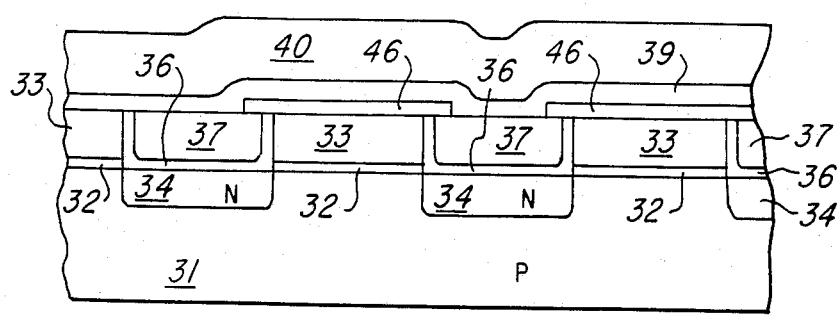

In yet another embodiment of the present invention, polycrystalline silicon "caps" 46, as shown in FIG. 4A, are formed by depositing and patterning a thin polycrystalline layer of the surface of the structured of FIG. 2D. The structure of FIG. 4A is futher processed as described with regard to FIG. 2E to form the structure of FIG. 4B. The structure of FIG. 4B provides greater programming efficiency by increasing the capacitive coupling between word line 40 and floating gates 33. This increased capacitive coupling provides a greater electric field (for the same substrate and active gate voltages) across gate oxide layers 32 than the structure of FIG. 2E. This greater electric field increases the number of electrons injected through gate oxide layers 32 thus increasing programming efficiency.

Figure 5:
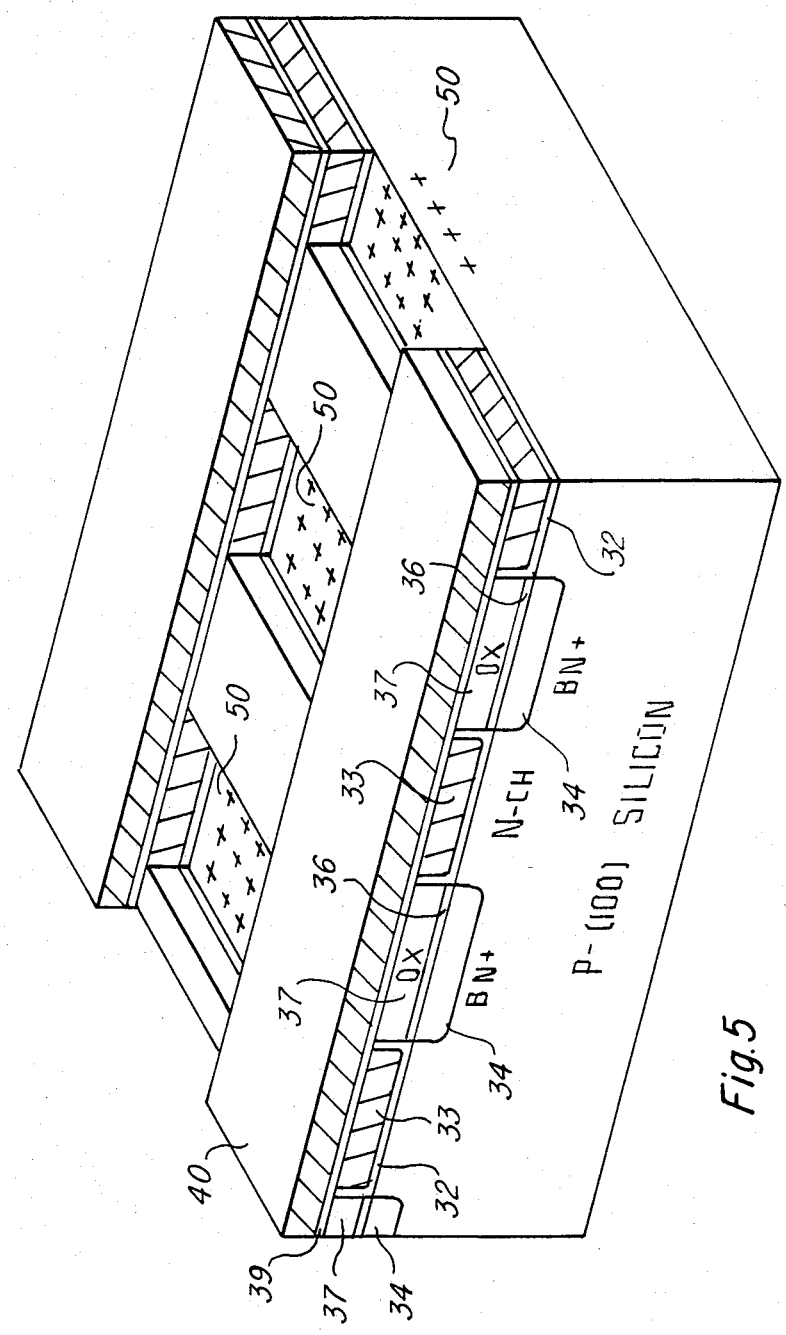
FIG. 5 is an isometric view of an EPROM fabricated using the steps described with regard to FIGS. 2A through 2E.

FIG. 5 is an isometric view of an EPROM fabricated using the steps described with regard to FIGS. 2A through 2E. FIG. 5 includes bit line isolation regions 50 which are P+ doped regions formed using techniques well known in the art.

TECHNICAL ADVANTAGES

The process of this invention provides a method for manufacturing an EPROM in which, because the field oxide regions are formed by chemical vapor deposition rather than by thermal oxidation, which rapidly diffuses dopants, very shallow source/drain regions may be fabricated. This provides the advantages of reduced lateral diffusion and greater hot-electron formation. Furthermore, because the field oxide regions are not formed by thermal oxidation, which produces lateral diffusion of the field oxide regions, a smaller EPROM array may be fabricated. In addition, silicided source/drains may be formed which are incompatible with prior art techniques.

We claim:
1. A nonvolatile memory array comprising:
    a plurality of source/drain regions formed in a substrate;
    a plurality of channel regions in said substrate disposed between said source/drain regions;
    a plurality of floating gates formed adjacent to but insulated from said channel regions;
    a plurality of field isolation regions formed on the surface of said substrate, disposed between said floating gates, and having a top surface substantially even with the top surfaces of said floating gates; and
    a plurality of active gates formed on the surface of said field oxide regions and said floating gates but insulated from said floating gates.

2. An electrically programmable memory array as in claim 1 further comprising highly conductive regions formed in said source/drain regions.

3. An electrically programmable memory array as in claim 2 wherein said highly conductive regions comprise refractory metal silicide.

4. An electrically programmable memory array as in claim 1 wherein said active gates are insulated from said floating gates by a dielectric comprising layers of silicon nitride and silicon dioxide.

5. An electrically programmable memory array as in claim 1 wherein said field isolation regions comprise silicon dioxide.

6. An electrically programmable memory array as in claim 1 wherein said field isolation regions are deposited by chemical vapor deposition and planarized.

7. An electrically programmable memory array comprising:
- a plurality of source/drain regions formed in a substrate;
- a plurality of channel regions in said substrate disposed between said source/drain regions;
- a plurality of floating gates formed adjacent to but insulated from said channel regions;
- a plurality of field isolation regions formed on the surface of said substrate, disposed between said floating gates, and having a top surface substantially even with the top surfaces of said floating gates;
- a plurality of conductive caps formed on the surface of said floating gates and said field isolation regions; and
- a plurality of active gates formed on the surface of said field oxide regions and said conductive caps but insulated from said conductive caps.

* * * * *